United States Patent
Ikeda et al.

(10) Patent No.: US 10,277,011 B2
(45) Date of Patent: Apr. 30, 2019

(54) LASER LIGHT SOURCE DEVICE

(71) Applicant: MITSUBISHI ELECTRIC CORPORATION, Chiyoda-ku, Tokyo (JP)

(72) Inventors: Kazutaka Ikeda, Tokyo (JP); Daisuke Morita, Tokyo (JP); Motoaki Tamaya, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 141 days.

(21) Appl. No.: 15/506,381

(22) PCT Filed: Oct. 16, 2015

(86) PCT No.: PCT/JP2015/079355
§ 371 (c)(1),
(2) Date: Feb. 24, 2017

(87) PCT Pub. No.: WO2016/063814
PCT Pub. Date: Apr. 28, 2016

(65) Prior Publication Data
US 2018/0226772 A1   Aug. 9, 2018

(30) Foreign Application Priority Data
Oct. 22, 2014 (JP) ................. 2014 215668

(51) Int. Cl.
H01S 5/024 (2006.01)
H01S 5/40 (2006.01)
H01S 5/022 (2006.01)

(52) U.S. Cl.
CPC ........ *H01S 5/4031* (2013.01); *H01S 5/02236* (2013.01); *H01S 5/02272* (2013.01);
(Continued)

(58) Field of Classification Search
CPC ............. H01S 5/02276; H01S 5/02423; H01S 5/02469; H01S 5/4025
See application file for complete search history.

(56) References Cited

U.S. PATENT DOCUMENTS 5,105,429 A * 4/1992 Mundinger ........... H01S 5/4025
257/714
2005/0141575 A1 6/2005 Lorenzen
(Continued)

FOREIGN PATENT DOCUMENTS

CN 101681962 A 3/2010
CN 103608985 A 2/2014
(Continued)

OTHER PUBLICATIONS

Office Action (Notification of Reasons for Refusal) dated Dec. 5, 2017, by the Japanese Patent Office in corresponding Japanese Patent Application No. 2016-555206, and an English Translation of the Office Action. (9 pages).
(Continued)

*Primary Examiner* — Michael Carter
(74) *Attorney, Agent, or Firm* — Buchanan Ingersoll & Rooney PC

(57) ABSTRACT

Provided is a laser light source device which has a plurality of semiconductor laser elements arranged in an array and is provided with: a heat sink; a sub-mount substrate which is placed on one end edge of the heat sink, which has a power feed path, and on which the semiconductor laser array is mounted; an insulation plate placed in an area other than the sub-mount substrate on the heat sink; a first electrode plate mounted on the insulation plate; a second electrode plate mounted on the insulation plate separately from the first electrode plate; metal wires electrically connecting respectively between the first electrode plate and the sub-mount substrate and between the second electrode plate and the
(Continued)

semiconductor laser array; and a cooling block on which the heat sink is mounted and which has a cooling water flow channel inside of the cooling block.

9 Claims, 7 Drawing Sheets

(52) U.S. Cl.
CPC ...... *H01S 5/02276* (2013.01); *H01S 5/02423* (2013.01); *H01S 5/02469* (2013.01); *H01S 5/4025* (2013.01); *H01L 2224/45144* (2013.01); *H01L 2224/48091* (2013.01); *H01L 2224/49175* (2013.01); *H01L 2224/73265* (2013.01); *H01L 2924/0002* (2013.01); *H01S 5/0224* (2013.01); *H01S 5/02492* (2013.01)

(56) References Cited

U.S. PATENT DOCUMENTS

| | | | | |
|---|---|---|---|---|
| 2010/0059787 | A1* | 3/2010 | Hoshina | H01L 33/54 257/100 |
| 2010/0260226 | A1 | 10/2010 | Tamaya et al. | |
| 2014/0105538 | A1* | 4/2014 | Toyohara | H01S 5/02272 385/14 |

FOREIGN PATENT DOCUMENTS

| | | |
|---|---|---|
| JP | 2-306681 A | 12/1990 |
| JP | 2003-031889 A | 1/2003 |
| JP | 2003-037325 A | 2/2003 |
| JP | 2007-019265 A | 1/2007 |
| JP | 2008-187095 A | 8/2008 |
| JP | 2008-300488 A | 12/2008 |
| JP | 2009-064932 A | 3/2009 |
| JP | 2010-283197 A | 12/2010 |
| JP | 2014-192166 A | 10/2014 |
| WO | WO 2009/081470 A1 | 7/2009 |

OTHER PUBLICATIONS

International Search Report (PCT/ISA/210) dated Dec. 28, 2015, by the Japanese Patent Office as the International Searching Authority for International Application No. PCT/JP2015/079355.
Written Opinion (PCT/ISA/237) dated Dec. 28, 2015, by the Japanese Patent Office as the International Searching Authority for International Application No. PCT/JP2015/079355.
Notification of Transmittal of Translation of the International Preliminary Report on Patentability (Forms PCT/IB/338 and PCT/IB/373) and the Written Opinion of the International Searching Authority (Form PCT/ISA/237) dated Apr. 25, 2017, in the corresponding International Application No. PCT/JP2015/079355. (12 pages).
Office Action dated Nov. 30, 2018, by the Chinese Patent Office in corresponding Chinese Patent Application No. 201580057474.2 and English translation of the Office Action. (9 pages).

\* cited by examiner

LASER LIGHT SOURCE DEVICE

TECHNICAL FIELD

The present invention relates to a laser light source device mounting a semiconductor laser array on which a plurality of semiconductor laser elements are arranged in an array.

BACKGROUND ART

In a laser light source device, when a current is fed to a semiconductor laser array formed by arranging a plurality of semiconductor laser elements in an array, the semiconductor laser array serves as an oscillation source of laser light as well as a heat generation source generating a large heat. In the semiconductor laser array, an oscillation wavelength changes depending on a temperature, and at a high temperature a laser output decreases and then the reliability of the semiconductor laser array is reduced. It is thereby preferable to provide a cooling structure so as to hold a proper temperature in the semiconductor laser array. An example of a configuration of the laser light source device with the cooling structure is shown in a Patent Document 1.

In the Patent Document 1, a semiconductor laser array is joined by using a conductive paste such as solder onto a heat sink referred to a cooling body in which a flow channel for cooling water is included. A material for the heat sink needs to have excellent thermal conductivity in order to dissipate heat of the semiconductor laser array. Further, the material needs to have excellent insulating properties so as to prevent rapid progression of corrosion in the heat sink caused by electrolytic corrosion (electrical erosion in the flow channel for cooling water). As the material having both of these properties, ceramics have been used as the material for the heat sink. A metal plated layer is formed onto an entire upper surface of the heat sink with plating process to constitute a power feed path. With such a configuration, the power feed path and the cooling water flow channel are separated to prevent the electrolytic corrosion.

PRIOR ART DOCUMENT

Patent Document

Patent Document 1: JP 2009-64932 A

SUMMARY OF THE INVENTION

Problems to be Solved by the Invention

However, in the laser light source device as in Patent Document 1, a nickel-gold plated layer formed on the entire surface of the heat sink (a cooling body) serves as the power feed path as described above. In the case of a semiconductor laser array that needs a large current such as several tens of amperes, the plated layer itself generates heat because the plated layer on the entire surface serving as the power feed path has large wiring resistance. Hence the temperature of the semiconductor laser array rises, which might result in a decreased laser output.

The present invention has been made to solve such a problem, and an object of the present invention is to provide a laser light source device capable of reducing a temperature rise of a semiconductor laser array and preventing electrolytic corrosion, to improve the long-term reliability.

Means for Solving the Problems

In order to achieve the above object, the present invention is configured as follows.

Namely, a laser light source device of a first aspect in the present invention is configured to include a semiconductor laser array with a plurality of semiconductor laser elements arranged in an array, the device comprising:

a plate-like heat sink;

a sub-mount substrate produced of a material with electrical insulation properties, configured to be placed at one end edge on the heat sink, and configured to have a power feed path on which the semiconductor laser array is mounted;

an insulation plate configured to be placed in a region other than the sub-mount substrate on the heat sink and produced of a material with electrical insulation properties;

a first electrode plate configured to be mounted on the insulation plate;

a second electrode plate configured to be mounted on the insulation plate separately from the first electrode plate and disposed over the first electrode plate; and metal wires configured to electrically connect respectively between the first electrode plate and the sub-mount substrate, and between the second electrode plate and the semiconductor laser array.

Effects of the Invention

In the laser light source device according to the first aspect of the present invention, the sub-mount substrate is placed at one end edge on the heat sink, the semiconductor laser array is mounted on the sub-mount substrate, and each of the first and second electrode plates is mounted on the heat sink via the insulation plate. Further, electrical connection is made respectively between the first electrode plate and the sub-mount substrate and between the second electrode plate and the semiconductor laser array via the metal wires. Hence the power feed path electrically connected with the semiconductor laser array is small as compared with the conventional case, which can thus prevent or reduce overheating of the semiconductor laser array caused by wiring resistance. Further, the semiconductor laser array is disposed on the sub-mount substrate with electrical insulation properties. Each of the first and second electrode plates is joined onto the heat sink with the electric insulating insulation plate interposed therebetween. Thus, the power feed path is configured without flowing the electric current through the heat sink. The power feed path and the cooling water are separated from each other due to the interposition of the insulation plate and the sub-mount substrate.

Hence the power feed path to the semiconductor laser array and the cooling water flow channel can be separated from each other, to prevent electrolytic corrosion (erosion) of the cooling water flow channel. Therefore, this can lead to improvement in long-term reliability of the laser light source device, as well as long-term use of the device.

EMBODIMENTS OF THE INVENTION

A laser light source device being an embodiment of the present invention is described below with reference to the drawings. Note that the same or similar constituent portions in the respective drawings are provided with the same numerals. In order to avoid an unnecessarily lengthy description and facilitate understanding of a person skilled in the art, a detailed description of a known matter and a repeated description of substantially the same configuration may be omitted. Contents of the following description and the attached drawings are not intended to restrict the scope or the subject matters recited in the claims.

First Embodiment

Figure 1A:
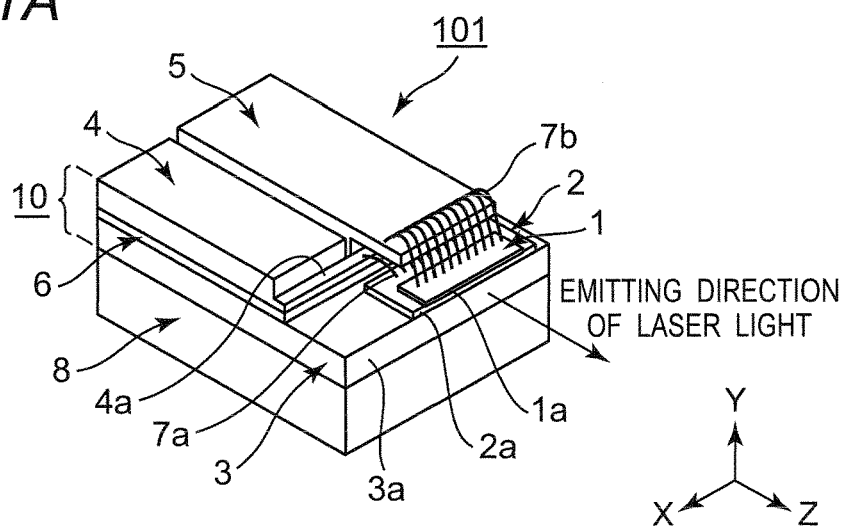
FIG. 1A is a perspective view showing an outline of a laser light source device according to a first embodiment of the present invention.
Figure 1B:
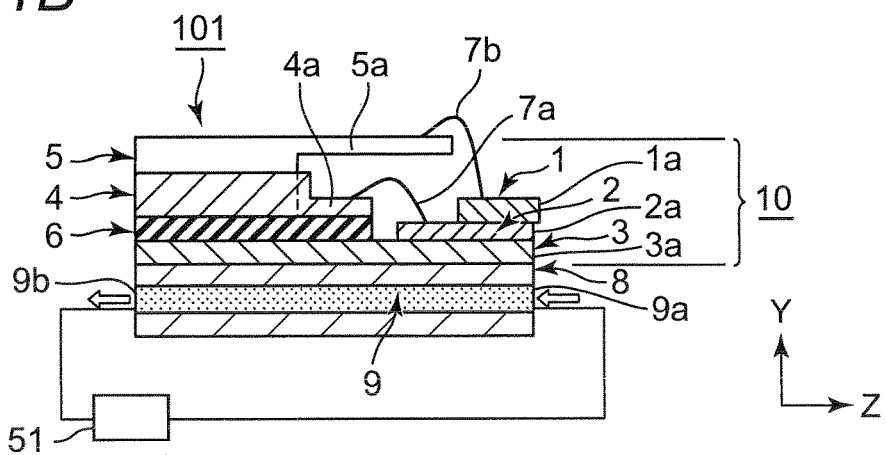
FIG. 1B is a schematic sectional view in the laser light source device shown in FIG. 1A.
Figure 1C:
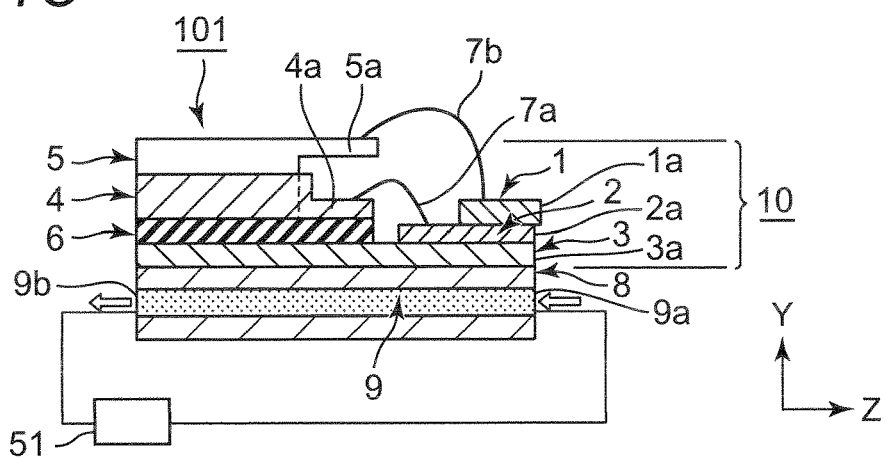
FIG. 1C is a schematic sectional view in the laser light source device shown in FIG. 1A.
Figure 2:
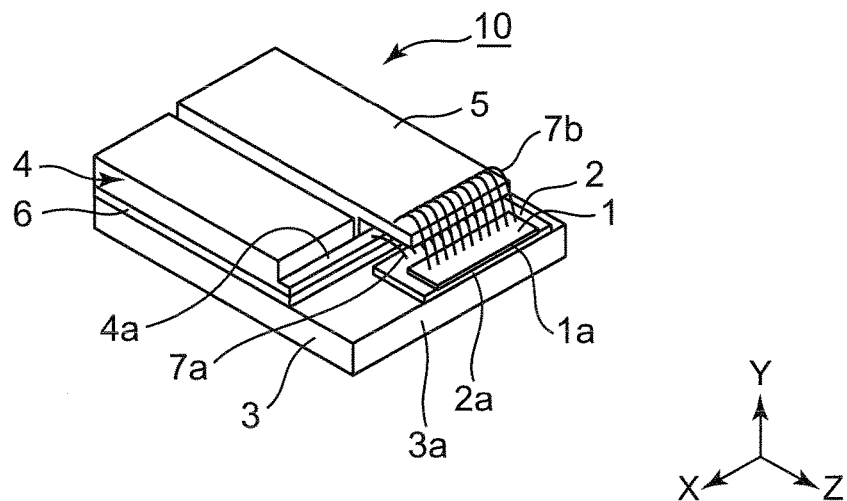
FIG. 2 is a perspective view showing an outline of a laser light source module constituting the laser light source device shown in FIG. 1A.

A laser light source device 101 in the present first embodiment shown in FIG. 1 (FIGS. 1A, 1B, and 1C) is provided with a laser light source module 10 shown in FIG. 2, and a cooling block 8 for cooling the laser light source module 10.

The laser light source module 10 in the present first embodiment includes a semiconductor laser array 1 formed by arranging a plurality of semiconductor laser elements in an array, and also includes a sub-mount substrate 2, a heat sink 3, an insulation plate 6, a first electrode plate 4, a second electrode plate 5, and metal wires 7 (7a, 7b).

The heat sink 3 is a plate-like member produced of a material with excellent thermal conductivity, such as a metal material like copper (hereinafter referred to as Cu) or the like, so as to efficiently dissipate heat generated from the semiconductor laser array 1 at the time of laser oscillation and efficiently transfer the heat to the cooling block 8. Further, gold (hereinafter referred to as Au) is laminated on the entire surface of the heat sink 3 by plating process.

The sub-mount substrate 2 is a substrate placed at one end edge on the heat sink 3 and configured to be mounted with the semiconductor laser array 1. The sub-mount substrate 2 is produced of a material with excellent in thermal conductivity and electrical insulation properties. For example, a ceramic material such as aluminum nitride (hereinafter referred to as ALN) or silicon carbide (hereinafter referred to as SiC) is used. A power feed path is formed on the upper surface of the sub-mount substrate 2, namely a mounting surface for the semiconductor laser array. The power feed path is formed by laminating metal plating of titanium (hereinafter referred to as Ti), Cu, nickel (hereinafter referred to as Ni), and Au in order. Here, the titanium plating corresponds to a lower layer in contact with the sub-mount substrate 2. Meanwhile, the semiconductor laser array 1 has an Au electrode on each of its upper and lower surfaces.

A mounting area for the semiconductor laser array 1 is formed on the upper surface of the plated layers of Ti, Cu, Ni, and Au as thus laminated, along an end surface 2a on the long side of the sub-mount substrate 2. The mounting area is formed by depositing platinum (hereinafter referred to as Pt), and an Au—Sn-based solder material or an Sn-based solder material in order. Here, the platinum layer corresponds to a lower layer in contact with the Au plated layer. In the mounting area as thus formed, the lower-surface Au electrode of the semiconductor laser array 1 is joined by soldering with the deposited solder material and mounted onto the plated layers of the sub-mount substrate 2. This leads to electrical and mechanical connection between the sub-mount substrate 2 and the semiconductor laser array 1.

In the mounting, the semiconductor laser array 1 is positioned such that an end surface 1a on the long side, which is the light-emitting surface side, of the semiconductor laser array 1 protrudes in the + direction of the Z-axis by about 0 to about 30 μm with respect to the end surface 2a of the sub-mount substrate 2. With this positioning, when each semiconductor laser element of the semiconductor laser array 1 performs laser oscillation, it is possible to prevent laser light from falling on the sub-mount substrate 2 and being shielded thereby.

As shown in FIG. 1A, the Z-axis direction corresponds to a direction in which laser light is emitted from the semiconductor laser array 1, and is a vertical direction to the end surface 1a on the light-emitting surface side of the semiconductor laser array 1.

Similarly to the upper surface of the sub-mount substrate 2, the lower surface thereof, namely the contact surface with the heat sink 3, is plated with Ti, Cu, Ni, and Au in order. Here, the Ti plating corresponds to the lower layer in contact with the sub-mount substrate 2. The top of the plated layers is deposited with an Au—Su-based solder material or an Sn-based solder material, which is the same material as the upper surface. Hence the sub-mount substrate 2 is mounted on the heat sink 3 by solder joint, using the deposited solder material. In this joint, the sub-mount substrate 2 is positioned with respect to the heat sink 3 such that the end surface 2a of the sub-mount substrate 2 matches an end surface 3a of the heat sink 3 in the Z-axis direction.

The insulation plate 6 is a plate member placed in a region other than the place where the sub-mount substrate 2 is occupied on the heat sink 3, and produced by a material with electrical insulation properties, such as a glass material or a PEEK material. In the present first embodiment, the insulation plate 6 is fixed to the heat sink 3 by using an adhesive material or a solder material behind the sub-mount substrate 2 mounted on the heat sink 3, namely on the − direction side of the Z-axis.

In the case of using the solder material in the fixing, when the sub-mount substrate 2 has already mounted on the heat sink 3, the use of a solder material having a lower melting point than that of the solder material deposited on the sub-mount substrate 2 can prevent re-melting of the solder material on the sub-mount substrate 2 and displacement of a mounting position of at least one of the semiconductor laser array 1 and the sub-mount substrate 2 with respect to the position on the heat sink 3.

The first electrode plate 4 and the second electrode plate 5 are electrode members mounted on the insulation plate 6 by, for example, the adhesive material. The electrodes are produced of a material with high electrical conductivity, such as Cu, and structured to have very small electrical resistance. An Au layer is laminated on the entire surface of each of the electrodes by plating process. Further, the first electrode plate 4 and the second electrode plate 5 each have a thickness of several mm which is sufficiently larger than that of the Au layer.

The first electrode plate 4 is, for example, a positive electrode, and in the present first embodiment, the first electrode plate 4 has an L-shape on a sectional surface (the XY-plane) along the long-side direction (the X-axis direction) of the sub-mount substrate 2, an L-shape on a sectional surface (the XZ-plane) vertical to the Y-axis direction, and also an L-shape on a sectional surface (the YZ-plane) vertical to the X-axis direction. A step portion 4a corresponding to one side of the L-shape is disposed parallel to the long-side direction of the sub-mount substrate 2 while holding a fixed interval from the sub-mount substrate 2 without being in contact therewith. Although FIGS. 1B and 1C show that the L-shaped step portion 4a of the first electrode plate 4 is higher than the power feed path in the sub-mount substrate 2, it is preferably as high as the power feed path. The L-shaped step portion 4a of the first electrode plate 4 is electrically connected with the sub-mount substrate 2 by using the metal wire 7a produced of a material such as Au. A plurality of metal wires 7a are provided in accordance with the number of semiconductor laser elements, and a joint section of each metal wire 7a on the step portion 4a is arranged parallel to the arrangement direction of the semiconductor laser elements in the semiconductor laser array 1 (the X-axis direction).

With the foregoing wiring structure formed, even when a plurality of semiconductor laser elements are arranged, a current can be uniformly fed to each semiconductor laser element. As the metal wire 7a, for example, there can be used an Au wire, or an Au ribbon or a Cu ribbon which has a wide line width.

The second electrode plate 5 is, for example, a negative electrode. The second electrode plate 5 is separated from the first electrode plate 4 and the sub-mount substrate 2 without being in contact therewith, and disposed parallel to the arrangement direction of the semiconductor laser elements in the semiconductor laser array 1 (the X-axis direction), to be mounted on the insulation plate 6. The second electrode plate 5 includes a protrusion 5a (FIGS. 1B, 1C) formed by protruding a flat surface of the second electrode plate 5 toward the semiconductor laser array 1 (the + direction of the Z-axis). The protrusion 5a of the second electrode plate 5 is electrically connected with the upper-surface electrode of the semiconductor laser array 1 by using the metal wire 7b. A plurality of metal wires 7b are provided in accordance with the number of semiconductor laser elements. The joint section of the metal wires 7b on the protrusion 5a is located parallel to the arrangement direction of the semiconductor laser elements in the semiconductor laser array 1 (the X-axis direction).

With the foregoing wiring structure formed, even when a plurality of semiconductor laser elements are arranged, a current can be uniformly fed to each semiconductor laser element. A wire or a ribbon with a large line width, which is made of a material such as Au, can be used as the metal wire 7b, similarly to the metal wire 7a.

The protrusion 5b of the second electrode plate 5 and the metal wires 7b are configured to be disposed over (in the + direction of the Y-axis) the L-shaped step portion 4a of the first electrode plate 4 and the metal wires 7a.

The cooling block 8 is fitted to the lower surface of the heat sink 3, and a cooling water flow channel 9 is formed inside the cooling block 8. In order to efficiently dissipate heat generated from the semiconductor laser array 1 when the laser oscillation is performed, it is preferable to form the cooling water flow channel 9 so as to allow cooling water to pass under (the − direction of the Y-axis) the joining area of the semiconductor laser array 1.

Further, as shown in FIGS. 1B and 1C, a flow channel inlet 9a of the cooling water flow channel 9 is provided on a side surface of the cooling block 8 which is located on the semiconductor laser array 1 side, and a flow channel outlet 9b is provided on a side surface of the cooling block 8 which is located on opposite side to the flow channel inlet 9a. However, the flow channel inlet 9a and the flow channel outlet 9b are not necessarily restricted to this placement as long as the cooling water flow channel 9 is formed so as to allow cooling water to pass under the joining area of the semiconductor laser array 1.

Note that the flow channel inlet 9a and the flow channel outlet 9b are omitted in FIG. 1A and the like, and the flow channel inlet 9a and the flow channel outlet 9b are connected to a cooling water circulation system 51 which is provided apart from the cooling block 8 and capable of controlling a cooling water temperature to be constant. Hence the cooling water circulates between the cooling water flow channel 9 inside the cooling block 8 and the cooling water circulation system 51, thereby allowing the cooling water temperature in the cooling water flow channel 9 in the cooling block 8 to be held constant.

Next, a description is given of a series of processes to assemble the laser light source device 101 having the foregoing configuration.

First, the sub-mount substrate 2 is placed on the heat sink 3 such that the end surface 2a of the sub-mount substrate 2 flushes with the end surface 3a of the heat sink 3 taken as a reference in the Z-axis direction. Further, as has been described, the semiconductor laser array 1 is placed on the sub-mount substrate 2 while the end surface 1a of the semiconductor laser array 1 is protruded in the + direction on the Z-axis by about 0 to about 30 μm, with respect to the end surface 2a of the sub-mount substrate 2 taken as a reference.

Subsequently, the Au—Sn-based solder material or the Sn-based solder material previously formed on the upper surface and the lower surface of the sub-mount substrate 2 is melt at once to join the sub-mount substrate 2 onto the heat sink 3, and join the semiconductor laser array 1 onto the sub-mount substrate 2.

Next, the insulation plate 6 is joined onto the heat sink 3 by using the adhesive material or the solder material behind the sub-mount substrate 2 mounted on the heat sink 3.

Subsequently, the first electrode plate 4 is joined and fixed onto the insulation plate 6 by using the adhesive material in such a position that the step portion 4a corresponding to one side of the L-shape is parallel to the long-side direction of the sub-mount substrate 2 and not in contact with the sub-mount substrate 2. As for the fixing between the first electrode plate 4 and the insulation plate 6, by use of through holes provided in the first electrode plate 4 and the insulation plate 6, and screw holes provided in the heat sink 3 (none of the holes is shown), the first electrode plate 4 and the insulation plate 6 may be integrally fixed onto the heat sink 3 with the screw clamp via an electric insulating bush.

Next, the upper surface of the plated layer of the sub-mount substrate 2 is connected with the L-shaped step portion 4a of the first electrode plate 4 by using the metal wires 7a.

Subsequently, the second electrode plate 5 is joined and fixed onto the insulation plate 6 by using the adhesive material such that the second electrode plate 5 is arranged adjacent to the first electrode plate 4 in the X-axis direction without being in contact with the first electrode plate 4 and the sub-mount substrate 2. As for the fixing of the second electrode plate 5, similarly to the case of the first electrode plate 4, the second electrode plate 5 and the insulation plate 6 may be integrally fixed onto the heat sink 3 with the screw clamp. After this, the protrusion 5a of the second electrode plate 5 is connected with the upper-surface electrode of the semiconductor laser array 1 with the metal wires 7b.

In the above manner, the laser light source module 10 shown in FIG. 2 is configured.

Finally, the laser light source module 10 is fixed with the screw clamp to the cooling block 8 with a thermal conducting sheet, a phase-change material, or thermal conductive grease interposed between the cooling block 8 and the laser light source module 10. In the cooling block 8, pipes, for example, are previously connected to the flow channel inlet 9a and the flow channel outlet 9b of the cooling water flow channel 9 in the cooling block 8. Thereby, the laser light source device 101 is formed.

Next, laser oscillation operation in the laser light source module 10 is described.

A description is given taking as an example a case where the semiconductor laser array 1 is mounted with a junction (anode) down type. When the semiconductor laser array 1 is mounted with the junction up type, it is only that the power feed path is located in the reversed direction, and the configuration and the effect remain unchanged.

When the semiconductor laser array 1 is mounted with the junction down type, a current fed from a power source (not shown) flows in the sequence of the power source→the first electrode plate 4→the metal wires 7a→the sub-mount substrate 2 (the plated layer (Ti, Cu, Ni, and Au) laminated on the upper surface)→the semiconductor laser array 1→the metal wires 7b→the second electrode plate 5→the power source, to cause the semiconductor laser array 1 to perform laser oscillation.

As described above, according to the laser light source device 101 of the present first embodiment, the semiconductor laser array 1 is mounted on the sub-mount substrate 2 with electrical insulation properties and high thermal conductivity. The first electrode plate 4 and the second electrode plate 5 are mounted on the insulation plate 6 with electrical insulation properties. Further, the power feed path is constructed of the first electrode plate 4, the metal wires 7a, the sub-mount substrate 2, the semiconductor laser array 1, the metal wires 7b, and the second electrode plate 5. Although the plated layer on the upper surface of the sub-mount substrate 2 which serves as part of the power feed path becomes a portion with relatively large electrical resistance, the foregoing configuration of the present first embodiment can reduce the area where the current passes through the plated layer, as compared with the conventional case. Thus, heat generation due to the wiring resistance is suppressed, to enable reduction in temperature rise of the semiconductor laser array 1 caused by the heat generation. This can result in prevention of a decrease in laser output of the semiconductor laser array 1, and the separation of the power feed path and the cooling water flow channel 9 from each other can eliminate an influence of electrolytic corrosion and improve the long-term reliability of the laser light source device.

Further, due to the structure where the protrusion 5b of the second electrode plate 5 and the metal wires 7b are disposed over the L-shaped step portion 4a of the first electrode plate 4 and the metal wires 7a (the + direction of the Y-axis), the metal wire 7a and the metal wire 7b for feeding power to each of the semiconductor laser elements of the semiconductor laser array 1 can be disposed with a uniform length. It is thereby possible to restrain deviation of the current to be fed to each semiconductor laser element, and prevent an amount of heat generation of some of the semiconductor laser elements from increasing, and thereby to improve the long-term reliability of the laser light source device.

According to the laser light source device 101, since the cooling block 8 and the laser light source device 10 are configured to be detachable from each other, the pipes for cooling water circulation which is fitted to the cooling block 8 need not be removed even when the laser light source module 10 is to be detached from the cooling block 8. According to the laser light source device 101, therefore, the laser light source module 10 can be easily replaced, and the workability in fitting and replacement can also be improved.

Second Embodiment

Figure 3A:
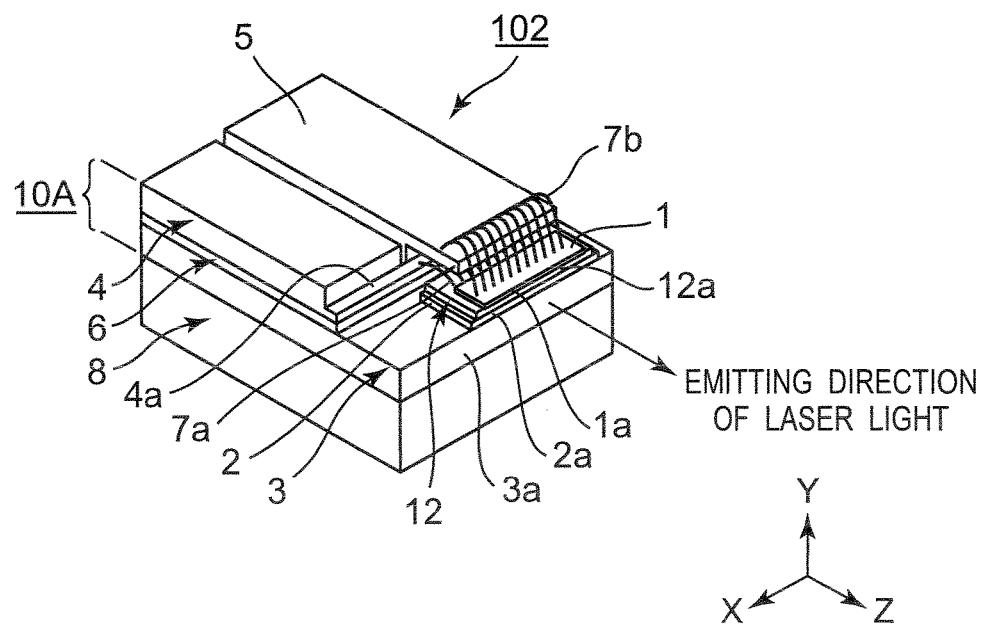
FIG. 3A is a perspective view showing an outline of a laser light source device according to a second embodiment of the present invention.
Figure 3B:
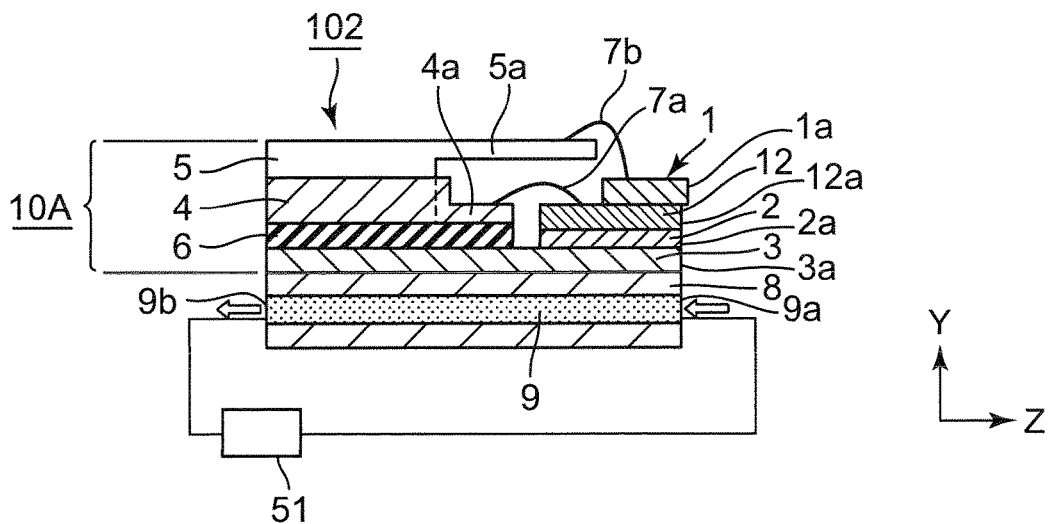
FIG. 3B is a schematic sectional view in the laser light source device shown in FIG. 3A.

FIG. 3 (FIGS. 3A and 3B) show a laser light source device 102 according to a second embodiment of the present invention. The laser light source device 102 of the present second embodiment is different, as compared with the laser light source device 101 of the first embodiment, in that an indirect substrate 12 is mounted on the sub-mount substrate 2, and after that, the semiconductor laser array 1 is mounted on the indirect substrate 12. The other configurations are the same as those of the laser light source device 101 of the first embodiment. Hence in the following, only the difference is described and the same portions are omitted to be described here. Note that a laser light source module constituting the laser light source device 102 of the present second embodiment is provided with numeral 10A, to be referred to as a laser light source module 10A.

The indirect substrate 12 is formed of a member having a linear expansion coefficient close to a linear expansion coefficient ($5.9 \times 10^{-6}$ $K^{-1}$) of the semiconductor laser array 1, such as a material containing copper-tungsten (hereinafter referred to as CuW, having a linear expansion coefficient of 6.0 to $8.3 \times 10^{-6}$ $K^{-1}$). The indirect substrate 12 as above is fixed to the sub-mount substrate 2 such that the end surface 2a of the sub-mount substrate 2 matches an end surface 12a of the indirect substrate 12 in the Z-axis direction. Further, the end surface 1a on the long side of the semiconductor laser array 1 is placed in a position where it is protruded in the + direction of the Z-axis by about 0 to about 30 μm with respect to the end surface 12a, taken as a reference, of the indirect substrate 12. Further, the metal wires 7a are wired between the indirect substrate 12 and the first electrode plate 4 to electrically connect therebetween.

The other configurations in the laser light source device 102 of the second embodiment are the same as those in the laser light source device 101 of the first embodiment.

According to the laser light source device 102 configured as above, the following effect can further be exerted while the effect exerted by the laser light source device 101 of the first embodiment can be obtained.

That is, by interposing the indirect substrate 12 between the sub-mount substrate 2 and the semiconductor laser array 1 as in the laser light source device 102 of the present embodiment, it is possible to relieve the stress to the semiconductor laser array 1 when joining, as well as the stress thereto at the time of operation of the laser light source device 102. Further, with the thermal conductivity of CuW being as high as 170 W/mK, heat generated in the semiconductor laser array 1 can be sufficiently dissipated. Moreover, an Au plated layer is laminated on the surface of the indirect substrate 12, and the indirect substrate 12 is connected with the first electrode plate 4 by the metal wires 7a. A current thus flows through the inside of the indirect substrate 12 and the plated layer on the sub-mount substrate 2. Therefore, increasing the thickness of the indirect substrate 12 can lower electrical resistance in the indirect substrate 12, and further reduce heat generation in the wiring resistance.

Third Embodiment

Figure 4A:
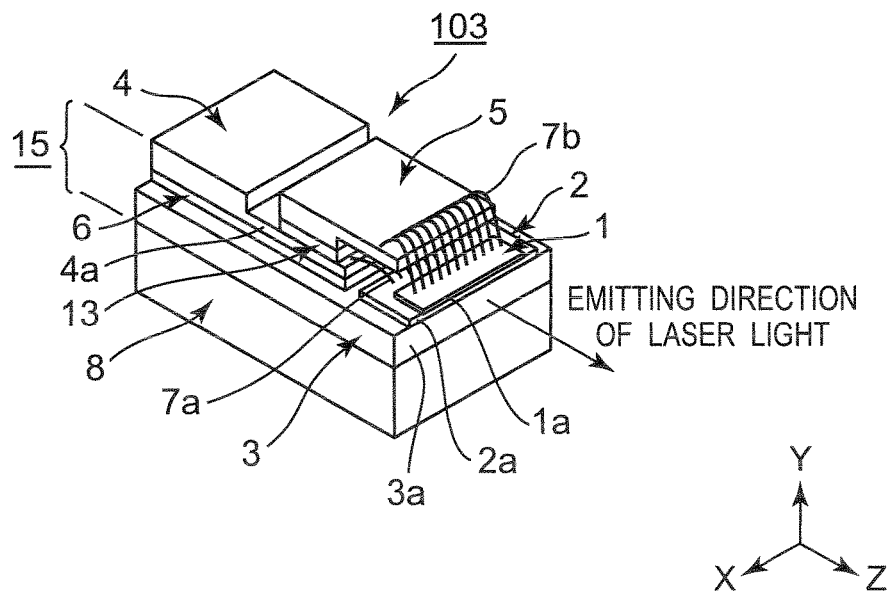
FIG. 4A is a perspective view showing an outline of a laser light source device according to a third embodiment of the present invention.
Figure 4B:
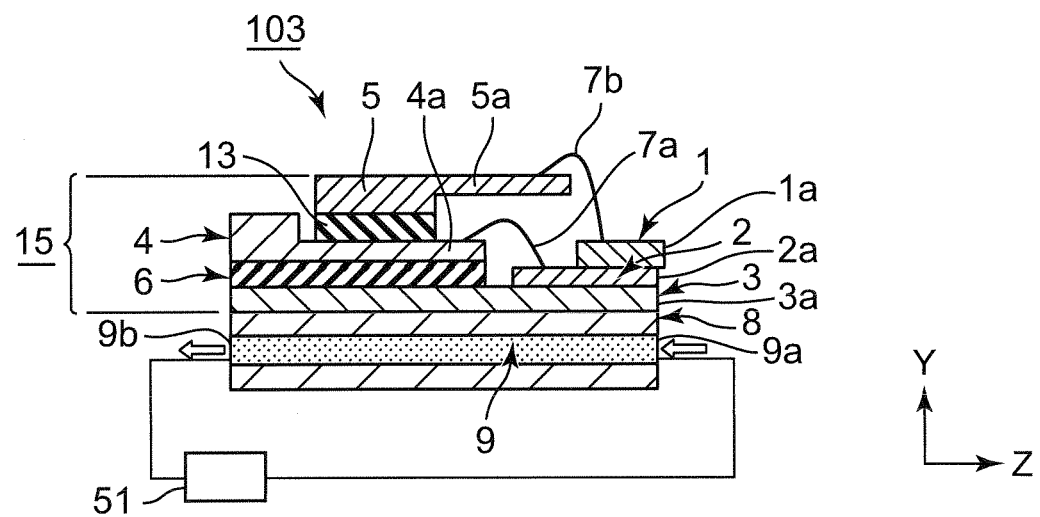
FIG. 4B is a schematic sectional view in the laser light source device shown in FIG. 4A.
Figure 5:
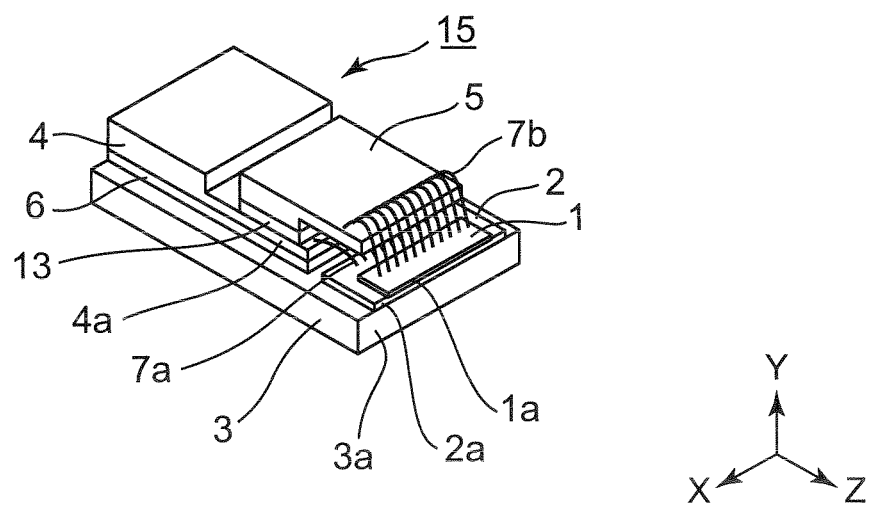
FIG. 5 is a perspective view showing an outline of a laser light source module constituting the laser light source device shown in FIG. 4A.

FIG. 4 (FIGS. 4A and 4B) show a laser light source device 103 according to a third embodiment of the present invention. FIG. 5 is a perspective view showing a laser light source module 15 constituting the laser light source device 103 of the present embodiment.

The laser light source device 103 of the present third embodiment is different, as compared with the laser light source device 101 of the first embodiment, in that the shape of the first electrode plate 4 is not the L-shape but a rectangular shape, and that the second electrode plate 5 is placed on the first electrode plate 4 via an insulation plate 13 (hereinafter referred to as second insulation plate 13) formed of a material having electrical insulation properties, without being in contact with the first electrode plate 4. The other configurations are the same as those of the laser light source device 101 of the first embodiment. Hence in the following, only the difference is described, and the same portions are omitted to be described here.

In the first embodiment, the first electrode plate 4 has the L-shape on the sectional surface (the XY surface) along the X-axis direction, the L-shape on the sectional surface (the XZ plane) vertical to the Y-axis direction, and also the L-shape on the sectional surface (the YZ plane). However, in the present third embodiment, as described above the first electrode plate 4 has a rectangular shape on each of the sectional surface (the XY plane) along the X-axis direction and the sectional surface (the XZ plane) vertical to the Y-axis direction, and has an L-shape on the sectional surface (the YZ plane) vertical to the X-axis direction, the L-shape having been formed by extending the step portion 4a with a flat surface toward the sub-mount substrate 2 side along the + direction of the Z-axis. Although FIG. 4B shows that the L-shaped step portion 4a of the first electrode plate 4 is higher than the power feed path in the sub-mount substrate 2, but it is preferably as high as the power feed path in the sub-mount substrate 2. In the present third embodiment, the insulation plate 6 provided between the first electrode plate 4 and the heat sink 3 corresponds to a "first insulation plate."

On the step portion 4a of the first electrode plate 4 as above, the second electrode plate 5 is disposed parallel to the arrangement direction (the X-axis direction) of the semiconductor laser elements in the semiconductor laser array 1 without being in contact with the first electrode plate 4 as described, to be placed and fixed via the second insulation plate 13.

The structural difference in the laser light source device 103 of the present third embodiment is as described above.

Next, in an assembly process of the present laser light source device 103, only a process different from the case of the first embodiment is described.

The sub-mount substrate 2 and the step portion 4a of the first electrode plate 4 are electrically connected with each other by using the metal wires 7a, and thereafter, the second insulation plate 13 is joined onto the step portion 4a of the first electrode plate 4 with the adhesive material. Subsequently, the second electrode plate 5 is disposed on the second insulation plate 13, in a position not in contact with the first electrode plate 4, and joined thereonto with the adhesive material.

As for the fixing between the second electrode plate 5 and the second insulation plate 13, by use of through holes provided in the second electrode plate 5, the second insulation plate 13, the first electrode plate 4 and the insulation plate 6, and screw holes provided in the heat sink 3 (none of the holes is shown), the second electrode plate 5, the second insulation plate 13, the first electrode plate 4, and the insulation plate 6 may be integrally fixed onto the heat sink 3 with the screw clamp via an electric insulating bush.

Subsequently, the protrusion 5a of the second electrode plate 5 is connected with the upper-surface electrode of the semiconductor laser array 1 by using the metal wires 7b.

The laser light source module 15 shown in FIG. 5 is formed by the above operation.

The laser light source module 15 is then fixed by using the screw clamp to the cooling block 8 with a thermal conducting sheet, a phase-change material, or thermal conductive grease interposed between the cooling block 8 and the laser light source module 15. In the cooling block 8, pipes, for example, are previously connected to the flow channel inlet 9a and the flow channel outlet 9b of the cooling water flow channel 9 in the cooling block 8. Thereby, the laser light source device 103 is formed.

Note that the laser oscillation operation in the laser light source device 103 is similar to the case of the first embodiment, and it is thus omitted to be described here.

According to the laser light source device 103 of the present third embodiment as described above, the following effect is further obtained in addition to the effect exerted by the laser light source device 101 of the first embodiment. That is, mounting the second electrode plate 5 on the first electrode plate 4 enables reduction in size of the laser light source device. Further, for example in the configuration of the first embodiment shown in FIG. 1A, the semiconductor laser array 1 and the first electrode plate 4 are arranged to be displaced in the X-axis direction. On the other hand, in the present third embodiment, as shown in FIG. 4A, the semiconductor laser array 1 and the first electrode plate 4 are disposed in alignment in the Z-axis direction without displacement in the X-axis direction. Further, since the semiconductor laser array 1 and the first electrode plate 4 have almost the same lengths in the X-axis direction, the power feed path for a current fed from the first electrode plate 4 to each semiconductor laser element of the semiconductor laser array 1 through the metal wire 7a has the same length in the longitudinal direction of the semiconductor laser array 1 (the X-axis direction). It is thereby possible to feed the current to each semiconductor laser element of the semiconductor laser array 1 more uniformly than the case of the first embodiment, and prevent an amount of heat generation of some of the semiconductor laser elements from increasing, and thereby to improve the long-term reliability of the laser light source device.

Fourth Embodiment

Figure 6A:
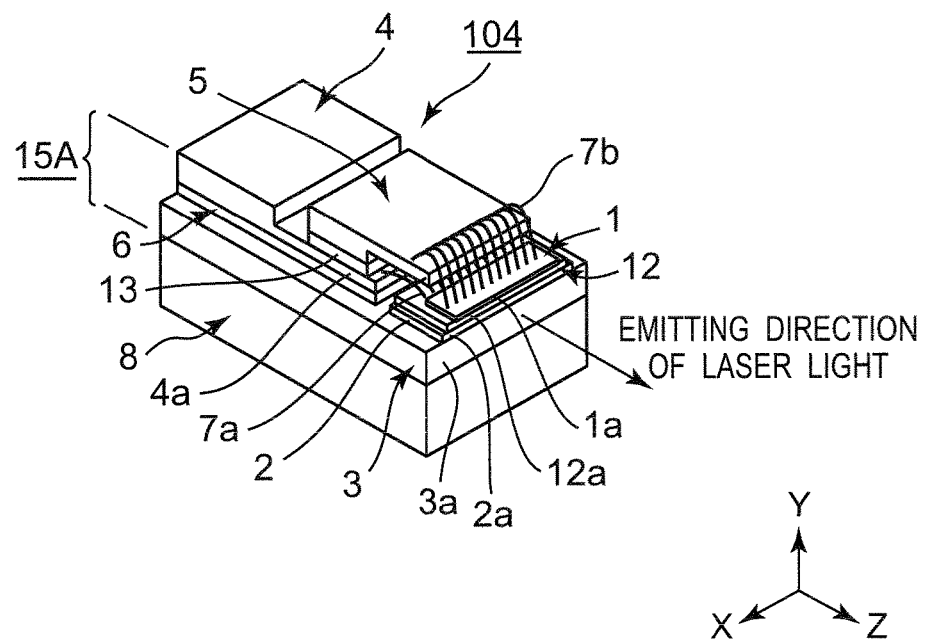
FIG. 6A is a perspective view showing an outline of a laser light source device according to a fourth embodiment of the present invention.
Figure 6B:
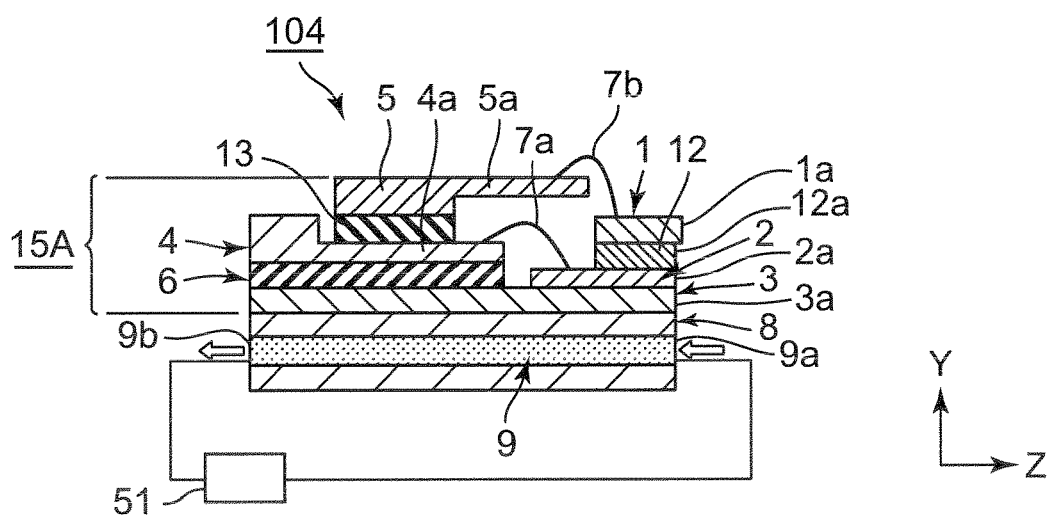
FIG. 6B is a schematic sectional view in the laser light source device shown in FIG. 6A.

FIG. 6 (FIGS. 6A and 6B) show a laser light source device 104 according to a fourth embodiment of the present invention. The laser light source device 104 of the present fourth embodiment is different, as compared with the laser light source device 103 of the third embodiment, in that the indirect substrate is mounted on the sub-mount substrate 2, and after that, the semiconductor laser array 1 is mounted on the indirect substrate 12. The other configurations are the same as those of the laser light source device 103 of the third embodiment. Hence in the following, only the difference is described, and the same portions are omitted to be described here. Note that a laser light source module constituting the laser light source device 104 of the present fourth embodiment is provided with numeral 15A, to be referred to as a laser light source module 15A.

The indirect substrate 12 is the same as the indirect substrate 12 already described in the second embodiment. It is a member having a linear expansion coefficient close to that of the semiconductor laser array 1, and formed of the material containing CuW, for example. Further, the placement position of the indirect substrate 12 is also the same as that in the configuration already described in the second embodiment. The indirect substrate 12 is fixed to the sub-mount substrate 2 such that the end surface 2a of the sub-mount substrate 2 matches the end surface 12a of the indirect substrate 12 in the Z-axis direction. The end surface 1a of the semiconductor laser array 1 is placed in a position where it is protruded in the + direction of the Z-axis by about 0 to about 30 μm with respect to the end surface 12a of the indirect substrate 12 taken as a reference. Further, the metal wires 7a are wired between the indirect substrate 12 and the first electrode plate 4 to electrically connect therebetween.

The other configurations in the laser light source device 104 of the fourth embodiment are the same as those in the laser light source device 103 of the third embodiment.

According to the laser light source device 104 configured as above, the following effect can further be exerted while the effect exerted by the laser light source device 103 of the third embodiment can be obtained.

That is, by interposing the indirect substrate 12 between the sub-mount substrate 2 and the semiconductor laser array 1 as in the laser light source device 104 of the present embodiment, it is possible to relieve the stress to the semiconductor laser array 1 at the time of joining, as well as the stress thereto at the time of operation of the laser light source device 102. Further, with the thermal conductivity of CuW being as high as 170 W/mK, heat generated in the semiconductor laser array 1 can be sufficiently dissipated. Moreover, an Au plated layer is laminated on the surface of the indirect substrate 12, and the indirect substrate 12 is connected with the first electrode plate 4 by the metal wires 7a. A current thus flows through the inside of the indirect substrate 12 and the plated layer on the sub-mount substrate 2. Increasing the thickness of the indirect substrate 12 can lower electrical resistance in the indirect substrate 12, and further reduce heat generation in the wiring resistance.

Fifth Embodiment

Figure 7A:
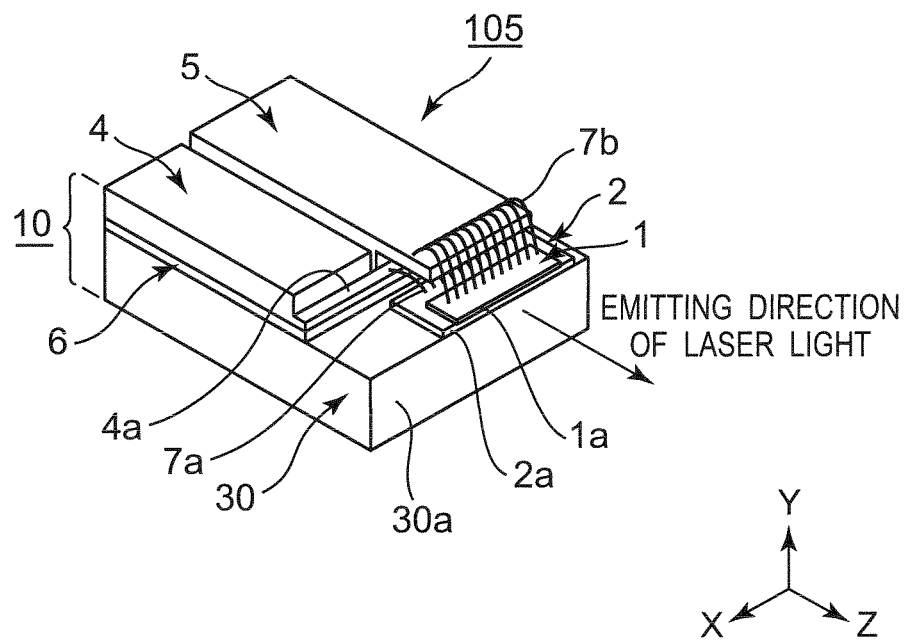
FIG. 7A is a perspective view showing an outline of a laser light source device according to a fifth embodiment of the present invention.
Figure 7B:
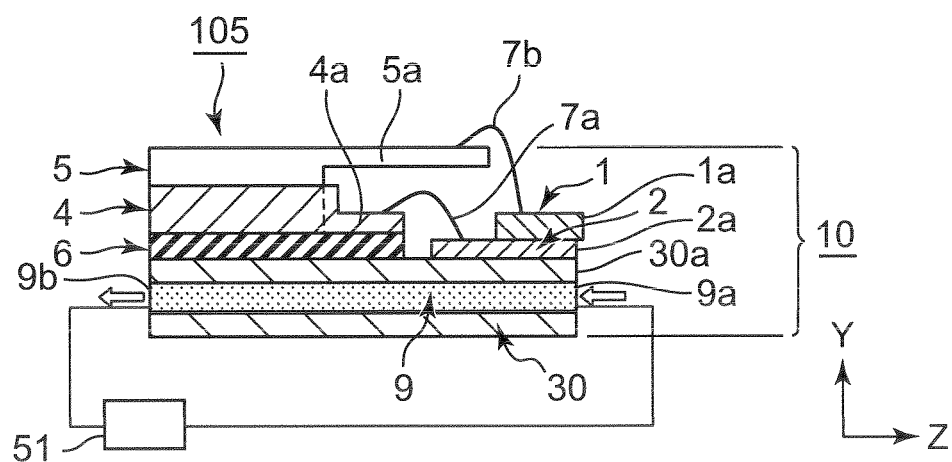
FIG. 7B is a schematic sectional view in the laser light source device shown in FIG. 7A.

FIG. 7 (FIGS. 7A and 7B) show a laser light source device 105 according to a fifth embodiment of the present invention. The laser light source device 105 of the present fifth embodiment is different, as compared with the laser light source device 101 of the first embodiment, in that a heat sink 30 is provided in place of the heat sink 3, and the cooling block 8 is removed. The other structures are the same as those of the laser light source device 101 of the first embodiment. Hence in the following, only the difference is described, and the same portions are omitted to be described here.

The heat sink 30 includes the cooling water flow channel 9 on its inside and has the function of the cooling block 8 in the first embodiment. Accordingly, as described above, the cooling block 8 has been removed in the laser light source device 105 of the present fifth embodiment.

In order to efficiently dissipate heat generated from the semiconductor laser array 1 when the laser oscillation is performed, the cooling water flow channel 9 is disposed so as to allow cooling water to pass under (in the − direction of the Y-axis) the joining area of the semiconductor laser array 1. In FIG. 7B, the flow channel inlet 9a of the cooling water flow channel 9 is provided on a side surface of the heat sink 30 which is located on the semiconductor laser array 1 side, and the flow channel outlet 9b is provided on a side surface of the heat sink 30 which is located on opposite side to the flow channel inlet 9a in the Z-axis. However, this configuration is not restrictive, and the cooling water flow channel 9 may simply be configured to be disposed so as to allow cooling water to pass under (in the − direction of the Y-axis) the joining area of the semiconductor laser array 1.

Further, the flow channel inlet 9a and the flow channel outlet 9b are connected to the cooling water circulation system 51 which is provided apart from the heat sink 30 and capable of controlling a cooling water temperature to be constant. Hence the cooling water circulates between the cooling water flow channel 9 in the heat sink 30 and the cooling water circulation system 51, thereby allowing the cooling water temperature in the cooling water flow channel 9 of the heat sink 30 to be held constant.

In the laser light source device 105 of the present fifth embodiment, the structural difference from the laser light source device 101 of the first embodiment is as described above.

According to the laser light source device 105 of the present fifth embodiment as described above, the following effect is obtained in addition to the effect exerted by the laser light source device 101. That is, by the heat sink 30 including the cooling water flow channel 9, it is possible to reduce thermal resistance from the semiconductor laser array 1 to a wall surface of the cooling water flow channel 9 in the heat sink 30, and suppress the temperature rise of the semiconductor laser array 1 when the laser oscillation is performed.

Sixth Embodiment

Figure 8A:
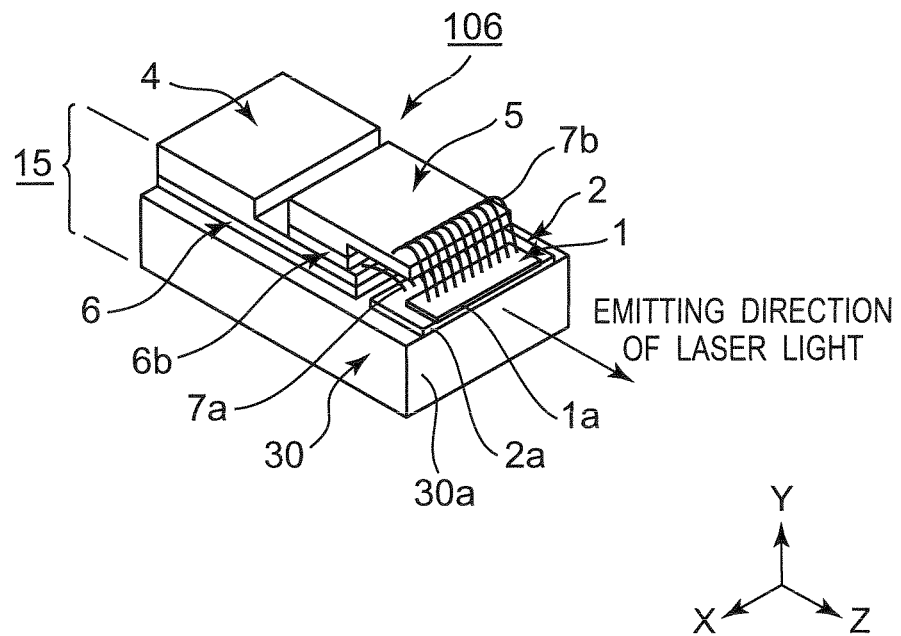
FIG. 8A is a perspective view showing an outline of a laser light source device according to a sixth embodiment of the present invention.
Figure 8B:
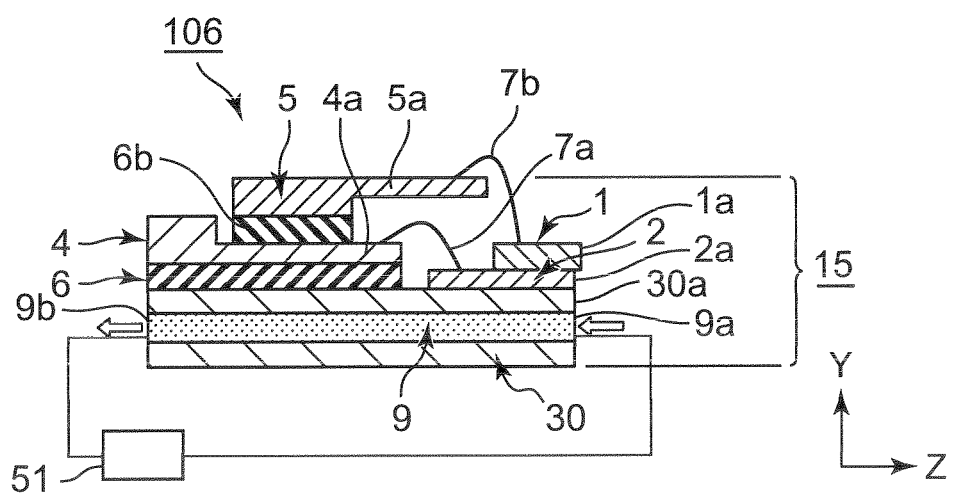
FIG. 8B is a schematic sectional view in the laser light source device shown in FIG. 8A.

FIG. 8 (FIGS. 8A and 8B) show a laser light source device 106 according to the sixth embodiment of the present invention.

The laser light source device 106 of the present sixth embodiment is different, as compared with the laser light source device 103 of the third embodiment, in that a heat sink 30 is provided in place of the heat sink 3, and the cooling block 8 is removed. The other structures are the same as those of the laser light source device 103 of the third embodiment. Hence in the following, only the difference is described, and the same portions are omitted to be described here.

The heat sink 30 is the same as that described in the fifth embodiment, and includes the cooling water flow channel 9 on its inside. Thus, the cooling block 8 has been removed also in the laser light source device 106 of the present sixth embodiment. Further, as shown in FIG. 8B, the cooling water flow channel 9 has the flow channel inlet 9a and the flow channel outlet 9b on the side surfaces of the heat sink 30 which oppose each other, and the flow channel inlet 9a and the flow channel outlet 9b are connected to the separately provided cooling water circulation system 51 which is provided apart from the heat sink 30 and capable of controlling a cooling water temperature to be constant.

In FIG. 8B, the flow channel inlet 9a of the cooling water flow channel 9 is provided on a side surface of the heat sink 30 which is located on the semiconductor laser array 1 side, and the flow channel outlet 9b is provided on a side surface of the heat sink 30 which is located on opposite side to the flow channel inlet 9a in the Z-axis. However, this configuration is not restrictive, and the cooling water flow channel 9 may simply be configured to be disposed so as to allow cooling water to pass under (in the – direction of the Y-axis) the joining area of the semiconductor laser array 1.

The structural difference in the laser light source device 106 of the present sixth embodiment is as described above.

Also in the laser light source device 106 of the present sixth embodiment as described above, similarly to the case of the laser light source device 105 of the fifth embodiment, it is possible to obtain the effect of reducing thermal resistance from the semiconductor laser array 1 to the wall surface of the cooling water flow channel 9 in the heat sink 30, and suppressing the temperature rise of the semiconductor laser array 1 at the time of laser oscillation.

Based on each of the embodiments described above, a configuration formed by combining some of embodiments can be employed, or constituents shown in different embodiments can be combined.

Note that properly combining freely selected embodiments of the above variety of embodiments can exert the effects provided by the respective embodiments.

Although the present invention has been fully described in connection with the preferable embodiments with reference to the attached drawings, a variety of changes and modifications are apparent to those skilled in the art. Such changes and modifications are to be understood as being included within the scope of the present invention defined by the appended claims unless they depart therefrom.

Further, Japanese Patent Application No. 2014-215668, filed on Oct. 22, 2014 is incorporated herein by reference in the entirety of the disclosures of the specification, the drawings, the claims and the abstract.

DESCRIPTION OF REFERENCE SYMBOLS

1 SEMICONDUCTOR LASER ARRAY
2 SUB-MOUNT SUBSTRATE
3 HEAT SINK
4 FIRST ELECTRODE PLATE
5 SECOND ELECTRODE PLATE
6 INSULATION PLATE
7a, 7b METAL WIRE
8 COOLING BLOCK
9 COOLING WATER FLOW CHANNEL
12 INDIRECT SUBSTRATE
13 SECOND INSULATION PLATE
30 HEAT SINK, and
101 to 106 LASER LIGHT SOURCE DEVICE

The invention claimed is:

1. A laser light source device configured to include a semiconductor laser array with a plurality of semiconductor laser elements arranged in an array, the device comprising:
   a plate-like heat sink;
   a sub-mount substrate produced of a material with electrical insulation properties, configured to be placed at one end edge on the heat sink, and configured to have a power feed path on which the semiconductor laser array is mounted;
   an insulation plate configured to be placed in a region other than the sub-mount substrate on the heat sink and produced of a material with electrical insulation properties;
   a first electrode plate configured to be mounted on the insulation plate;
   a second electrode plate configured to be mounted on the insulation plate separately from the first electrode plate and disposed over only a portion of the first electrode plate; and
   metal wires configured to electrically connect respectively between the first electrode plate and the sub-mount substrate, and between the second electrode plate and the semiconductor laser array.

2. The laser light source device according to claim 1, wherein the metal wires connecting between the second electrode plate and the semiconductor laser array, and the second electrode plate are configured to be arranged over the metal wires connecting between the first electrode plate and the sub-mount substrate, and the first electrode plate.

3. The laser light source device according to claim 1, wherein the first electrode plate is configured to have an L-shaped structure.

4. The laser light source device according to claim 1, wherein the second electrode plate configured to be mounted on the first electrode plate via a second insulation plate with electrical insulation properties.

5. The laser light source device according to claim 1, wherein the second electrode plate is configured to have a protrusion protruding toward the semiconductor laser array.

6. The laser light source device according to claim 1, wherein the heat sink is configured to have inside a cooling water flow channel.

7. The laser light source device according to claim 1, further comprising:
   an indirect substrate configured to be disposed between the semiconductor laser array and the sub-mount substrate, and have a linear expansion coefficient equivalent to a linear expansion coefficient of the semiconductor laser array.

8. The laser light source device according to claim 1, wherein a material for the sub-mount substrate is silicon carbide or aluminum nitride.

9. A laser light source device configured to include a semiconductor laser array with a plurality of semiconductor laser elements arranged in an array, the device comprising:
   a plate-like heat sink;
   a sub-mount substrate produced of a material with electrical insulation properties, configured to be placed at one end edge on the heat sink, and configured to have a power feed path on which the semiconductor laser array is mounted;
   an insulation plate configured to be placed in a region other than the sub-mount substrate on the heat sink and produced of a material with electrical insulation properties;
   a first electrode plate configured to be mounted on the insulation plate;
   a second electrode plate configured to be mounted on the insulation plate separately from the first electrode plate and disposed over the first electrode plate; and
   metal wires configured to electrically connect respectively between the first electrode plate and the sub-mount substrate, and between the second electrode plate and the semiconductor laser array wherein the first electrode plate is configured to have an L-shaped structure.

* * * * *